United States Patent [19]

Chandran et al.

[11] Patent Number: 4,700,346
[45] Date of Patent: Oct. 13, 1987

[54] SELF-CHECKING, DUAL RAILED, LEADING EDGE SYNCHRONIZER

[75] Inventors: Srikumar R. Chandran; Mark S. Walker, both of San Jose, Calif.

[73] Assignee: Tandem Computers Incorporated, Cupertino, Calif.

[21] Appl. No.: 733,293

[22] Filed: May 10, 1985

[51] Int. Cl.⁴ .............................................. G06F 9/00
[52] U.S. Cl. ......................................... 371/1; 371/47; 371/63
[58] Field of Search ........................................ 371/1–2, 371/4, 42, 46–47, 63, 67–68, 70; 364/200 MS File, 900 MS File; 375/106–108, 110–111, 113–114, 121

[56] References Cited

U.S. PATENT DOCUMENTS

| | | | |
|---|---|---|---|
| 4,328,583 | 5/1982 | Stodola | 371/63 X |
| 4,342,112 | 7/1982 | Stodola | 371/68 |
| 4,408,327 | 10/1983 | Wahl et al. | 371/47 |
| 4,520,483 | 5/1985 | Arita et al. | 371/68 |
| 4,551,836 | 11/1985 | Parikh | 371/1 |
| 4,589,066 | 5/1986 | Lam et al. | 364/200 |

OTHER PUBLICATIONS

*Computer System Architecture*, by M. Morris Mano, p. 411, Section 11-3: "11-3 Asynchronous Serial Interface", 1976.

*Primary Examiner*—Gary V. Harkcom
*Attorney, Agent, or Firm*—Townsend and Townsend

[57] ABSTRACT

A digital logic circuit and method for synchronizing the leading edges skewed true-complement signal pair. The circuit is comprised of two similar, interconnected circuit halves, each of which includes three D flip-flop stages. The outputs from the second D flip-flop stages from the two circuit halves are applied to the two inputs of two identical logic gates, such that the signal pair is synchronously transmitted to a pair of output gates through a third D flip-flop stage in each circuit half. The second D flip-flop stages also prevent metastable states from reaching the synchronizer output. Metastable states may result if the input setup time is violated for the first D flip-flop stages. The third D flip-flop stage in each circuit half also eliminates any signal irregularities generated in the logic circuitry from appearing on the synchronizer output lines. The circuit is self-checking in that any single fault in the input signals or in the synchronizer circuit itself will result in the synchronizer output pair not having a true complement relationship.

5 Claims, 5 Drawing Figures

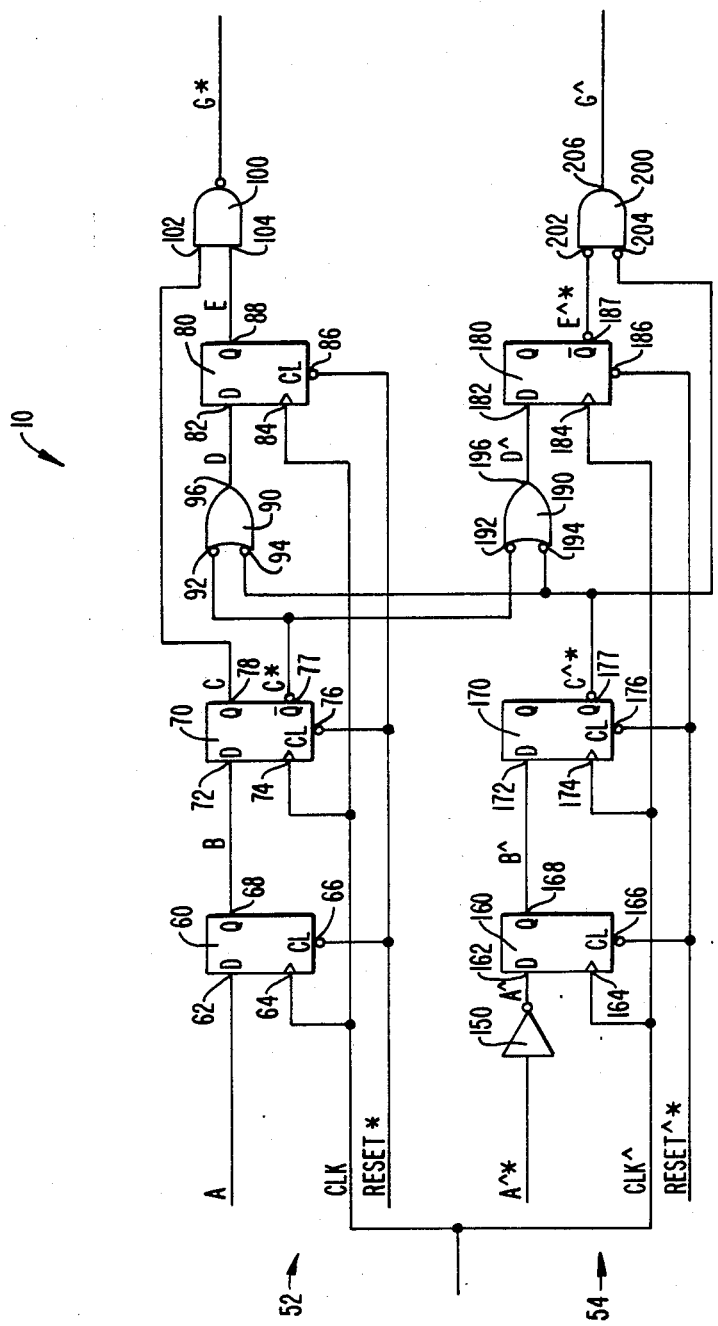
FIG.—1.

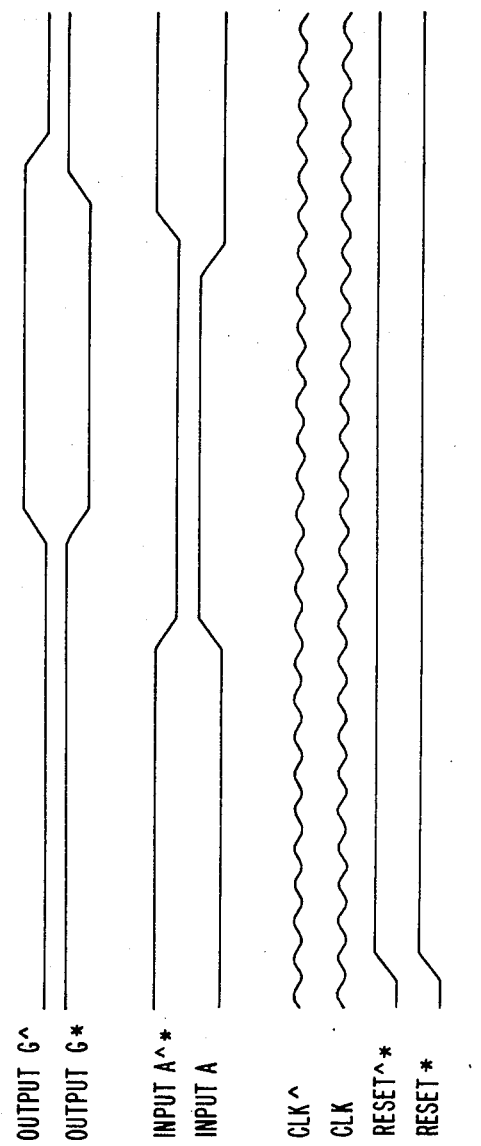
FIG._2.

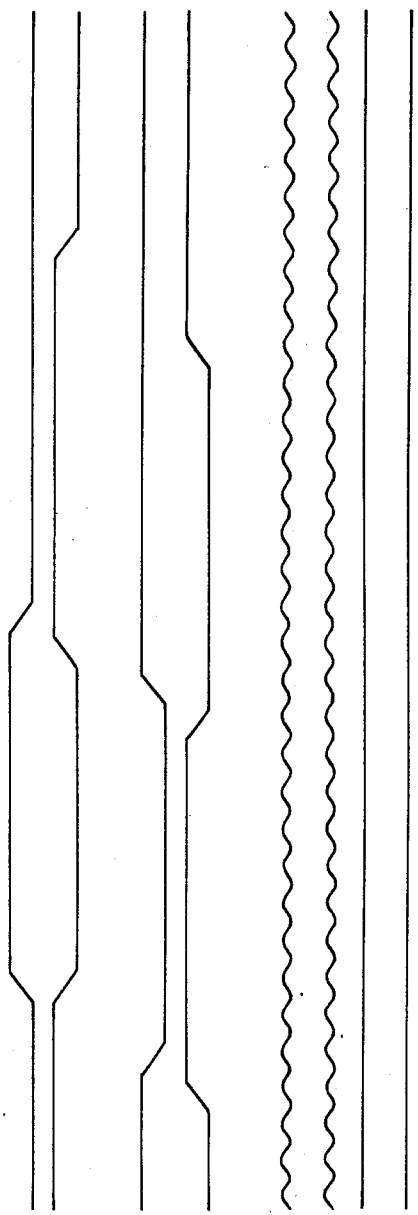
FIG._3.

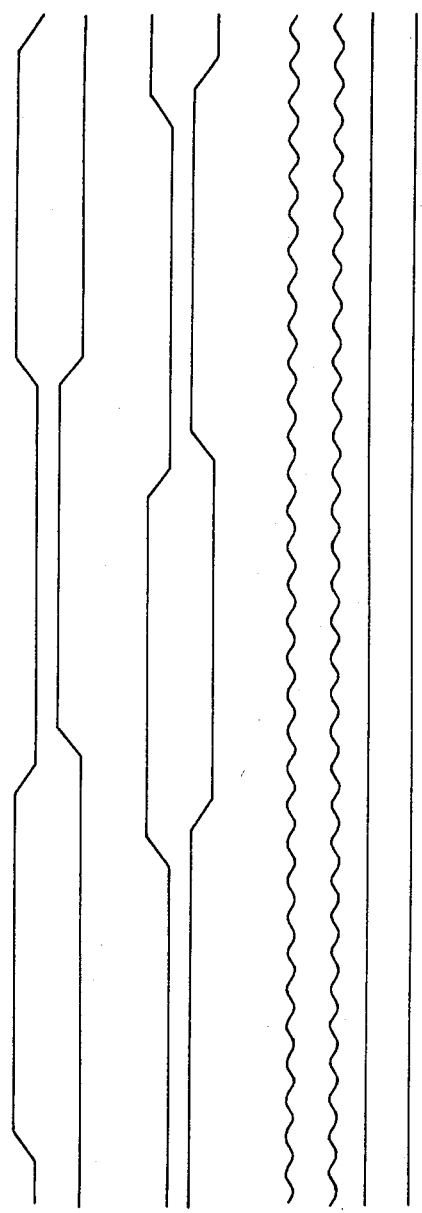
FIG._4.

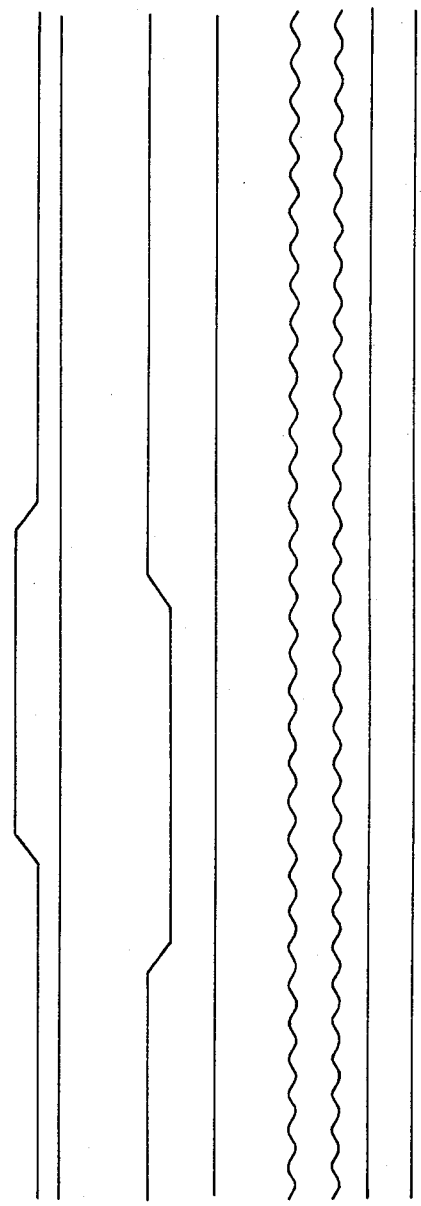
FIG._5.

SELF-CHECKING, DUAL RAILED, LEADING EDGE SYNCHRONIZER

FIELD OF THE INVENTION

The present invention relates to a digital signal synchronizer for synchronizing the leading edges of a true-complement pair of digital control signals such as are used in dual modular redundant processor systems where both signals in the pair must be valid during a predetermined window in time in order to cause a desired event to occur. The synchronizer circuit of the present invention is self-checking so as to detect and report errors in the synchronizer circuit itself as well as in the input signals.

BRIEF DESCRIPTION OF THE PRIOR ART

It is known in the art to control the transfer of data between two independent units, such as a memory and an I/O device, by using control strobe pulses to synchronize such transfers. See M. Morris Mano, *Computer Systems Architecture*, page 411 (1976). Generally, a control strobe pulse from a processor is applied along with a timing signal to an AND gate, the output of which is applied to the I/O device to be activated to ensure that such I/O device is activated to receive or provide data at the proper time. Otherwise, the data in the system could become contaminated. In such circumstances, synchronization is required only between the single control strobe signal and a clock-pulse. However, where two redundant processors are involved as described below, synchronization is also necessary between the redundant control strobe signals produced by each of the two processors.

In a typical processor, such as the Motorola MC 68000 microprocessor, a total of five (5) strobe lines are used to control communications with I/O devices for memory mapped reads and writes: an address strobe (AS*); an upper data byte strobe (UDS*); a lower data byte strobe (LDS*); a data acknowledge strobe (DTACK*); and a read/write strobe (R/W*). Such control strobe pulses are of relatively short duration. Due to physical tolerances inherent in the manufacture of the hardware, the position in time of the leading edge of such control strobe pulses varies with each particular processor over a range of tolerances even when the processors are driven in lockstep by a common clock. Thus, two processors of the same type with identical inputs may produce control strobes that vary slightly in both duration and position in time.

Such variations in the duration and timing of control strobe pulses within the processors' normal tolerance range do not present a problem in many applications. However, such variations cause problems where a pair of processors is operated in lockstep and redundant control strobes from each processor must be present in synchronism for either control strobe to be recognized as valid.

Redundant control strobes are used, for example, in the dual modular redundant processor system described in the the co-pending United States patent application entitled "Lock Stepped, High-Level Self-Checking Intelligent I/O Controller," Ser. No. 733, 679, filed May 10, 1985, which is assigned to the same assignee as the present application. Such systems are intended for use where integrity of data is particularly important. In the system described in the co-pending application, the technique used to maintain the integrity of data in the event of a fault in a system component is to make portions of the system redundant.

For high speed processing, such redundant control strobes must be communicated synchronously within a narrow window in time. If the leading edges of both control signal pulses are skewed in time such that they are not received within that narrow time window, or if either signal is not in the proper state during that time window, the control strobe will not be treated as valid, in which case, the device they are controlling will not be activated. Thus, the leading edges of the control strobes must not be skewed in time.

Even in systems in which a redundant pair of processors operated in lockstep from a common clock generate redundant, dual railed signals (i.e., a "true" control strobe signal from one processor and a "complement" control strobe signal from the other processor, due to design and manufacturing tolerances of the processors, both such dual railed signals may not be in the proper state during the necessary time window for the control strobe to be treated as valid. Skewed control strobes may result, for example, where one processor is operating at the low end of the permitted tolerance range and the other near the high end. Such timing tolerances in processors permit control strobe signals from two processors to arrive at a device skewed in time so as to cause the device to treat the incoming dual railed control strobe signal as invalid. For this reason, it is necessary to synchronize the control strobe signals from the two processors.

Because of the nature of synchronizers, the clock period during which two signals are synchronized by such prior art devices is unknown. This is because the synchronizer output could be in a metastable state during the first clock period where the synchronizer setup time has been violated, thereby falsely indicating that a control strobe is invalid, whereas in fact the second signal of the dual railed pair may merely be late. When the setup time of the first synchronizer stage is violated, the output of that stage will be unknown for one clock period (either high, low, or metastable). In conventional systems this is not a problem, since on the next clock period, the output will be a known good value (the risk of the synchronizer output being in a metastable state can be reduced by adding a second synchronizer stage). However in a dual modular redundant processor system where two signals of a dual railed pair must be sampled simultaneously, the possibly unsynchronized output during this period is unacceptable.

It is therefore an object of the present invention to provide a means for synchronizing the leading edges of a true and complement redundant pair of control strobe pulses from redundant processors where the leading edges of such pulses are skewed in time.

It is another object of the present invention to provide a means for distinguishing between a pair of control strobe signals that are a valid true-complement pair with their leading edges skewed in time due to processor tolerances, and a pair of control strobe signals that, due to an error resulting from a fault, are not a valid true-complement pair.

It is another object of the present invention to provide a self-checking synchronizer circuit for synchronizing a pair of skewed input signals such that a fault in the synchronizer circuit itself will be reported as an error condition.

It is another object of the present invention to locate transient and intermittent error conditions before such errors propogate.

SUMMARY OF THE INVENTION

The present invention overcomes the shortcomings of the prior art by providing a novel method and apparatus for synchronizing the leading edges of a true-complement signal pair where such leading edges are skewed in time. The present invention is comprised of two similar circuits, each of which employs three D flip-flops driven by a common clock signal. The two circuits are interconnected through two active-low-input OR gates, the outputs of which are synchronized due to their each receiving an input signal from each of the two circuits. The "true" signal of the true-complement pair is clocked through to the output of the first flip-flop of the first circuit. The "complement" signal of the true-complement pair is inverted and then clocked through to the output of the first flip-flop of the second circuit. The output of the first flip-flop in each circuit is clocked through to the output of the second flip-flop of each circuit on the next activating clock transition. The second flip-flop in each of the two circuits prevents a metastable state from appearing at the synchronizer outputs, which otherwise could result if the clock transition occurred before the expiration of the "setup" time of the first flip-flop stages. The second flip-flop stages and additional clock cycle allow the outputs of the first flip-flops sufficient time to stablilize at either a "1" or "0" before being clocked into the second flip-flops.

The output from the second flip-flop in each of the two circuits is applied to the input of each of two active-low input OR gates connected in parallel. A pair of OR gates is used instead of a single gate to preserve the self-checking nature of the synchronizer circuit. Each of these OR gates has as its two inputs the output from each of the second stage flip-flops, which provides the necessary synchronization between the two circuits. The output of the active-low input OR gate of each circuit is applied to a third D flip-flop, which electrically conditions the output signal from the active-low input OR gate. The outputs of the second and third flip-flops in each circuit are combined by a NAND gate and an active-low input AND gate, respectively, to synchronously yield the "complement" and "true" output signals.

Three clock cycles are required before changes in the input signals to the synchronizer are reflected in the output signals of the sychronizer. The leading edges of the true-complement output signal pair will be synchronized if the leading edges of the true-complement input signal pair arrive skewed less than one clock period minus the maximum setup time of the first flip-flop in one circuit and minus the minimum hold time (i.e., the short time interval that the input signal must remain stable after a clock transition in order for the logic state of input signal to be transferred from the D input to the Q output) of the first flip-flop in the other circuit. Input signals that exceed the maximum skew are detected as faults in the true-complement output signal pair. In the preferred embodiment, the trailing edges of the true-complement output signal pair are synchronized by the synchronous activation of the reset lines.

The synchronizer is self-checking in that the failure of any circuit element of the synchronizer is also detected as an error in the true-complement output signal pair.

DESCRIPTION OF THE DRAWINGS

FIG. 1 is a schematic diagram of the dual rail, leading edge synchronizer circuit of the present invention;

FIG. 2 is a timing diagram illustrating the outputs of the synchronizer of the present invention in response to a synchronized true-complement input pair;

FIG. 3 is a timing diagram illustrating the outputs of the synchronizer of the present invention in response first to a skewed true-complement input pair and subsequently to an A'* input signal error;

FIG. 4 is a timing diagram illustrating the outputs of the synchronizer of the present invention in response to an opposite skew of the true-complement input pair; and FIG. 5 is a timing diagram illustrating the outputs of the synchronizer of the present invention in response to an error in the A input signal.

DETAILED DESCRIPTION OF THE PREFERRED EMBODIMENT

The preferred embodiment of the self-checking dual railed, leading edge synchronizer circuit of the present invention is adaptable to many applications requiring pairs of signals to be synchronized, including an I/O controller of the type described in the co-pending United States patent application entitled "High Level Self-Checking Intelligent I/O Controller", Ser. No. 733,679 filed May 10, 1985, which is assigned to the same assignee as the present application. As described in the co-pending application, the I/O controller (not shown) uses a pair of processors (not shown) operated in lockstep from a common clock to provide a fault tolerant system. The processors, which are denominated the "true" and "complement" processors, respectively, provide a true-complement pair of signals for each desired control signal and each data and address bit. Such redundancy increases the capability of the system to tolerate faults. Use of such redundant processor systems requires that the signal pairs by sychronized so that the true-complement relationship can be accurately maintained and detected during critical time windows.

Synchronizer 10 of the present invention, which is illustrated in FIG. 1, comprises two similar, interconnected circuits 52 and 54. Circuit 52 has the following three signal inputs: A; a clock, which is designated "CLK"; and a reset complement, which is designated "RESET*" (clear inputs 66, 76 and 86 of D flip-flops 60, 70 and 80, respectively, are active low). Similarly, circuit 54 has the following three inputs: A'*; a clock, which is designated "CLK'", and a reset complement, which is designated "RESET'*" (clear inputs 166, 176 and 186 of D flip-flops 160, 170 and 180, respectively, are active low). In the preferred embodiment CLK and CLK' are the same signal. Herein, the symbol "*" is used to designate the complement of a signal.

In the usual case, the input signals A and A'* are a true-complement pair of control strobe signals, the leading edges of which may be skewed in time due to system tolerances. As discussed below, the present invention synchronizes the leading edges of the skewed A and A'* signals such that the output pair G* and G' will be a true-complement synchronous pair. The synchronizer circuit of the present invention will synchronize the leading edges of A and A'* if the skew between them does not exceed one clock period minus the maximum setup time of D flip-flop 60 minus the minimum hold time of D flip-flop 160 (or vice versa). In the event of a fault, however, the A and A'* input signals may be an asynchronous pair having no true-complement relationship. In that event, where the leading edges of the A and A'* signals are separated by more than one clock period minus the maximum setup time and minimum hold time of flip-flops 60 and 160, the output signals G* and G' will not be a true-complement pair, thereby indicating an error condition.

With reference to FIG. 1, circuit 52 is comprised of D flip-flops 60, 70 and 80, OR gate 90 with active-low inputs (which is logically equivalent to an NAND gate), and NAND gate 100. A RESET* signal line is applied to clear inputs 66, 76 and 86 to reset D flip-flops 60, 70 and 80, respectively. Similarly, circuit 54 is comprised of D flip-flops 160, 170 and 180, OR gate 190 with active-low inputs, and AND gate 200 with active-low inputs (which is logically equivalent to a NOR gate). Circuit 54 also includes an inverter 150, which inverts the A'* signal before it is applied to D input 162 of flip-flop 160. A RESET'* signal line is applied to clear inputs 166, 176 and 186 to reset D flip-flops 160, 170 and 180, respectively. The same CLK (CLK') signal is applied to clock inputs 64, 74 and 84 of D flip-flops 60, 70 and 80, respectively, and to clock inputs 164, 174 and 184 of D flip-flops 160, 170 and 180, respectively.

Signal A is applied to D input 62 of flip-flop 60. Upon a transition from logic "1" to logic "0" of the CLK signal (an "active clock transition") applied to input 64, the logic state at D input 62 is transferred to Q output 68, assuming that the logic state at D input 62 had been present long enough before (i.e., the maximum setup time) and after (i.e., the minimum hold time) the active clock transition for flip-flop 60 to reach steady state. If flip-flop 60 had not reached steady state after a transition in the logic level applied to D input 62 prior to the active clock transition (i.e, there was an active clock transition during the setup time), after the active clock transition Q output 68 may be in a metastable, logic "1" or logic "0" state. Similarly, if signal A changes state after an active clock transition and before flip-flop 60 has reached steady state with the logic level applied to D input 62 transferred to Q output 68 (i.e., before the expiration of the minimum hold time of flip-flop 60), Q output 68 also may be in a metastable, logic "1" or logic "0" state. Thus, the logic state of Q output 68 is uncertain where the setup time or minimum hold time of flip-flop 60 is violated in the foregoing manner. The same is true for Q output 168 of D flip-flop 160 when an active clock transition occurs on clock input 164 during the setup time or minimum hold time of flip-flop 160 following a change in state of the A'* signal.

Q output 68 is connected to D input 72 of flip-flop 70; therefore, they will be at the same logic level. Thus, in the case where the setup time and minimum hold time of flip-flop 60 is not violated, the logic state of the A input signal is transferred to Q output 68 and to D input 72 on the first active clock transition and to Q output 78 on the second active clock transition. In this case where the setup time or the minimum hold time of flip-flop 60 is violated, the logic level at Q output 68 will have settled at either "0" or "1" by the time the second active clock transition occurs, at which time that logic state (which may be incorrect) will be transferred to Q output 78 of flip-flop 70. In that case, however, the logic state at D input 62 will be correctly transferred to Q output 68 (and hence to D input 72 of flip-flop 70) on the second active clock transition. Therefore, in cases where the setup time or hold time of flip-flop 60 is violated, the logic state of the A input signal may not be transferred to Q output 78 until the third active clock transition, as discussed below.

Flip-flops 160 and 170 in lower circuit 54 operate in an identical fashion with respect to the A'* input signal, which is inverted by inverter 150 before being applied to D input 162 of flip-flop 160. Therefore, in cases where neither the setup time nor the hold time of flip-flop 160 is violated, the logic state of input signal A'* will be present at $\bar{Q}$ output 177 of flip-flop 170 after the second active clock transition, the A'* signal having been inverted first by inverter 150 and again by flip flop 170. Similarly, in cases where the setup time and hold time of flip-flop 160 is violated, the logic state of the A'* input signal may not be transferred to $\bar{Q}$ output 177 until the third active clock transition.

$\bar{Q}$ output 177 is applied to input 194 of active-low-input OR gate 190 and to input 94 of active-low-input OR gate 90. $\bar{Q}$ output 77 of flip-flop 70 is applied to input 92 of active-low-input OR gate 90 and to input 192 of active-low-input OR gate 190. As described below, the interconnection of upper circuit 52 and lower circuit 54 through active-low-input OR gates 90 and 190 is critical to synchronizing the leading edges of the A and A'* input signals.

Synchronizer 10 is designed to synchronize the leading edges of input signals A and A'* where the leading edge of signal A is a transition from logic "0" to "1" and the leading edge of signal A'* is a transition from logic "1" to "0". Therefore, where the setup and hold times of flip-flops 60 and 160 are not violated and the leading edges of signals A and A'* already are in synchronism after the second active clock transition, $\bar{Q}$ output 77 and $\bar{Q}$ output 177 will be at logic "0". Accordingly, inputs 92 and 94 of active-low-input OR gate 190 will be at logic "0", and output 96 and output 196 will be at logic "1" during the second clock cycle. Output 96 is connected to D input 82 of flip-flop 80, and output 196 is connected to D input 182 of flip-flop 180. Therefore, on the third active clock transition Q output 88 will be "1", and $\bar{Q}$ output 187 will be "0". Q output 88 is connected to input 104 of NAND gate 100, and $\bar{Q}$ output 187 is connected to input 202 of active-low-input AND gate 200. Input 102 of NAND gate 100 is connected to Q output 78 of flip-flop 70, which will be "1" after the third active clock transition. Therefore, both inputs to NAND gate 100 will be "1" and its output 106 (i.e., G*) will be "0". Input 204 of active-low-input AND gate 200 is connected to $\bar{Q}$ output 177, which will be "0" after the third active clock transition. Therefore, both inputs to active-low-input AND gate 200 will be "0" and its output 206 (i.e., G') will be "1".

The leading edges of G* and G' are synchronized because the respective inputs to NAND gate 100 and active-low-input AND gate 200 are not in the proper condition to cause a change in the logic state at their respective outputs 106 and 206 until the respective outputs 96 and 196 of active-low-input OR gates 90 and 190 are simultaneously transferred to the Q output 88 and $\bar{Q}$ output 187 on the third active clock transition.

If the leading edge of signal A arrives at D input 62 before the first active clock transition, and signal A'* (after being inverted by inverter 150) arrives at D input 162 after the first active clock transition, the G* and G' outputs also will synchronously change state on the third clock cycle. In that case, as described above for the synchronous case, Q output 78 will be "1" and $\bar{Q}$ output 77 will be "0" after the second active clock transition, and $\overline{Q}$ output 177 still will be "1" until after the third active clock transition. Therefore, after the second active clock transition inputs 92 and 94 of active-low-input OR gate 90 will be "0" and "1", respectively, causing its output 96 to be "1"; and inputs 192 and 194 of active-low-input OR gate 190 will be "0" and "1", respectively, causing its output 196 to be "1". However, after the second active clock transition Q output 88 (and hence input 104) will still be "0", and $\overline{Q}$ output 187 (and hence input 202) will still be "1". So after the second active clock transition, both inputs to active-low-input AND gate 200 will be "1" and output 206 (i.e., G') will be "0"; and the respective inputs to NAND gate 100 will be "1" and "0" so that its output 106 (i.e., G*) will be "1".

After the third active clock transition, $\overline{Q}$ output 177 will have changed to "0", thereby changing inputs 94 and 194 to "0"; however, with this combination of inputs, outputs 96 and 196 of active-low-input OR gates 90 and 190 remain "1". After the third active clock transition, Q output 88 and (hence input 104) will be "1" and $\overline{Q}$ output 187 (and hence input 202) will be "0". Then, inputs 202 and 204 both will be "0", causing output 206 (i.e., G') to change state to "1"; and inputs 102 and 104 both will be "1" causing output 106 (i.e., G*) to change state to "0".

Operation of synchronizer 10 where the leading edge of signal A'* (after being inverted by inverter 150) arrives at D input 162 before the first active clock transition and the leading edge of signal A arrives at D input 62 after the first active clock transition is completely analogous to that just described for the obverse situation. Similarly, the operation of synchronizer 10 also is completely analogous where the setup time for one or hold time for the other (or both) of flip-flops 62 and 162 is (or are) violated.

The trailing edges of A and A'* can be synchronized by the synchronous application of the RESET* and RESET'* signals to clear active-low-inputs 66, 76, 86, 166, 176 and 186, respectively. Upon application of the RESET* and RESET'* signals, the Q outputs go to "0" and the $\overline{Q}$ outputs go to "1". Therefore, inputs 102 and 104 both will be "0", causing its output 106 (i.e., G*) to be "1"; and inputs 202 and 204 both will be "1", causing its output 206 (i.e., G') to be "0". Application of synchronous reset signals RESET* and RESET'* is illustrated in FIG. 2.

The signals at the 18 circuit nodes of synchronizer 10, each of which is referred to herein as a "net", are designated as follows (net number/net name): 1/A; 2/A'*; 3/CLK; 4/CLK'; 5/RESET*; 6/RESET'*; 7/G*; 8/G'; 9/B; 10/C; 11/C*; 12/C'*; 13/D; 14/E; 15/A'; 16/B'; 17/D' and 18/E'*. The relationships among the six input signals (i.e., A'*, A, CLK', CLK, RESET'* and RESET*) and the two outputs signals (i.e., G* and G') of synchronizer 10 are illustrated schematically in FIGS. 2-5.

In FIG. 2, the two signals in each of the three pairs of input signals and the one pair of output signals are synchronized with each other. In FIG. 3, the leading edges of signals A and A'* are not synchronized (i.e., the leading edge of A precedes the leading edge of A'*), but synchronizer 10 nevertheless outputs a synchronous G* and G' true-complement pair. FIG. 3 also illustrates that the trailing edges of G* and G' are not synchronized without synchronously activating the RESET* and RESET'* signals. Finally, FIG. 3 illustrates that an input pair resulting from an A'* signal fault (i.e., A and A'* are not a true-complement pair) causes the output pair G* and G' also not to be a true-complement pair, thereby indicating the existence of a fault. In FIG. 4, the leading edge of signal A'* precedes the leading edge of signal A, but synchronizer 10 nevertheless produces output signals G* and G' with their leading edges synchronized. In FIG. 5, an error in signal A causes the output pair G* and G' not to be a true-complement pair, thereby indicating the existence of a fault which caused the input error.

Table 1 at the end of this specification illustrates the output states of G* and G' as 53 combinations of input signals are sequentially applied. The entries in Table 1 are for synchronous inputs. Thus, Table 1 does not illustrate skew between A and A'* transitions. As illustrated by patterns 11 through 18 in Table 1, when input signal A switches to "1" and input signal A'* switches to "0", output G* switches to "0" and output G' switches to "1" during the third clock cycle thereafter (i.e., pattern 18 in Table 1).

Another important feature of synchronizer circuit 10 is that it is self-checking in that the failure of any circuit element of synchronizer circuit 10 results in output signals G* and G' not being a true-complement pair. Such an error will be detected by the circuitry (not shown) receiving the G* and G' signals. The self-checking feature of synchronizer circuit 10 is achieved in part by the interrelationship between circuits 52 and 54 established by an input from each of circuits 52 and 54 being applied to both of active-low-input OR gates 90 and 190.

As illustrated in Table 2 at the end of this specification, synchronizer 10 can be tested by means of various diagnostic patterns of input signals to determine the nature (i.e., whether stuck at 0 or 1) and location (i.e., which net is stuck at 0 or 1) of a fault in synchronizer 10 which is causing an error. In the preferred embodiment, a fault that causes a net to be stuck at either 0 or 1 will be detected by the sequential application of patterns 1 through 19 of Table 1 to synchronizer 10. A stuck at 0 or stuck at 1 fault in any of the 18 nets in synchronizer 10 will produce a conflict in either output G* (net 7) of G' (net 8) for each particular pattern. For example, the first line of entries in Table 2 shows that a conflict in the output of net 7 for pattern 1 indicates that net 7 is stuck at 0. A conflict in the output of net 7 in pattern 8 reflects that net 7 is stuck at 1.

It should be noted that in the self-checking technique in synchronizer 10 a particular pattern may indicate any of serveral faults (e.g., pattern 18 will indicate stuck at 0 or stuck at 1 faults in a number of different nets). It would be possible to develop circuitry which provided a particular pattern for each fault such that the specific fault causing an error in output G' or G* would be identified. However, in the preferred embodiment, it is not necessary to isolate a fault to a particular net. It is sufficient merely to determine the presence of a fault anywhere within synchronizer circuit 10.

While the preferred embodiment of the present invention has been illustrated and described, it is to be understood that the invention is not limited to the precise construction herein disclosed, and the right is reserved to all changes and modification coming within the scope of the invention as defined in the appended claims.

TABLE 1

FAULT FREE PILOT RUN RESULTS

| PATTERN NUMBER | INPUTS | | | | | | OUTPUTS | |
|---|---|---|---|---|---|---|---|---|
| | A | A'* | CLK | CLK* | RESET* | RESET'* | G* | G' |
| 1 | 0 | 1 | 1 | 1 | 0 | 0 | 1 | 0 |
| 2 | 0 | 1 | 0 | 0 | 0 | 0 | 1 | 0 |
| 3 | 0 | 1 | 1 | 1 | 0 | 0 | 1 | 0 |
| 4 | 0 | 1 | 1 | 1 | 1 | 1 | 1 | 0 |
| 5 | 0 | 1 | 0 | 0 | 1 | 1 | 1 | 0 |
| 6 | 0 | 1 | 1 | 1 | 1 | 1 | 1 | 0 |
| 7 | 0 | 1 | 0 | 0 | 1 | 1 | 1 | 0 |
| 8 | 0 | 1 | 1 | 1 | 1 | 1 | 1 | 0 |
| 9 | 0 | 1 | 0 | 0 | 1 | 1 | 1 | 0 |
| 10 | 0 | 1 | 1 | 1 | 1 | 1 | 1 | 0 |
| 11 | 0 | 1 | 0 | 0 | 1 | 1 | 1 | 0 |
| 12 | 1 | 0 | 1 | 1 | 1 | 1 | 1 | 0 |
| 13 | 1 | 0 | 0 | 0 | 1 | 1 | 1 | 0 |
| 14 | 1 | 0 | 1 | 1 | 1 | 1 | 1 | 0 |
| 15 | 1 | 0 | 0 | 0 | 1 | 1 | 1 | 0 |
| 16 | 1 | 0 | 1 | 1 | 1 | 1 | 1 | 0 |
| 17 | 1 | 0 | 0 | 0 | 1 | 1 | 1 | 0 |
| 18 | 1 | 0 | 1 | 1 | 1 | 1 | 0 | 1 |
| 19 | 1 | 0 | 0 | 0 | 1 | 1 | 0 | 1 |
| 20 | 1 | 0 | 1 | 1 | 1 | 1 | 0 | 1 |
| 21 | 1 | 0 | 0 | 0 | 1 | 1 | 0 | 1 |
| 22 | 1 | 0 | 1 | 1 | 1 | 1 | 0 | 1 |
| 23 | 1 | 0 | 0 | 0 | 1 | 1 | 0 | 1 |
| 24 | 1 | 0 | 1 | 1 | 1 | 1 | 0 | 1 |
| 25 | 1 | 0 | 0 | 0 | 1 | 1 | 0 | 1 |
| 26 | 1 | 0 | 1 | 1 | 1 | 1 | 0 | 1 |
| 27 | 1 | 0 | 0 | 0 | 1 | 1 | 0 | 1 |
| 28 | 1 | 0 | 1 | 1 | 1 | 1 | 0 | 1 |
| 29 | 1 | 0 | 0 | 0 | 1 | 1 | 0 | 1 |
| 30 | 1 | 0 | 1 | 1 | 1 | 1 | 0 | 1 |
| 31 | 1 | 0 | 0 | 0 | 1 | 1 | 0 | 1 |
| 32 | 0 | 1 | 1 | 1 | 1 | 1 | 0 | 1 |
| 33 | 0 | 1 | 0 | 0 | 1 | 1 | 0 | 1 |
| 34 | 0 | 1 | 1 | 1 | 1 | 1 | 0 | 1 |
| 35 | 0 | 1 | 0 | 0 | 1 | 1 | 0 | 1 |
| 36 | 0 | 1 | 1 | 1 | 1 | 1 | 1 | 0 |
| 37 | 0 | 1 | 0 | 0 | 1 | 1 | 1 | 0 |
| 38 | 0 | 1 | 1 | 1 | 1 | 1 | 1 | 0 |
| 39 | 0 | 1 | 0 | 0 | 1 | 1 | 1 | 0 |
| 40 | 0 | 1 | 1 | 1 | 1 | 1 | 1 | 0 |
| 41 | 0 | 1 | 0 | 0 | 1 | 1 | 1 | 0 |
| 42 | 0 | 1 | 1 | 1 | 1 | 1 | 1 | 0 |
| 43 | 0 | 1 | 0 | 0 | 1 | 1 | 1 | 0 |
| 44 | 0 | 1 | 1 | 1 | 1 | 1 | 1 | 0 |
| 45 | 0 | 1 | 0 | 0 | 1 | 1 | 1 | 0 |
| 46 | 0 | 1 | 1 | 1 | 1 | 1 | 1 | 0 |
| 47 | 0 | 1 | 0 | 0 | 1 | 1 | 1 | 0 |
| 48 | 0 | 1 | 1 | 1 | 1 | 1 | 1 | 0 |
| 49 | 0 | 1 | 0 | 0 | 1 | 1 | 1 | 0 |
| 50 | 0 | 1 | 1 | 1 | 1 | 1 | 1 | 0 |
| 51 | 0 | 1 | 0 | 0 | 1 | 1 | 1 | 0 |
| 52 | 0 | 1 | 1 | 1 | 1 | 1 | 1 | 0 |
| 53 | 0 | 1 | 0 | 0 | 1 | 1 | 1 | 0 |

TABLE 2

COMPLETE FAULT LIST

| NUMBER/NAME OF NET WITH FAULT | NET WITH FAULT STUCK AT 0 | | NET WITH FAULT STUCK AT 1 | |
|---|---|---|---|---|
| | PATTERN NUMBER | OUTPUT NET IN WHICH ERROR IS PRESENT | PATTERN NUMBER | OUTPUT NET IN WHICH ERROR IS PRESENT |
| 7/G* | 1 | 7 | 8 | 7 |
| 8/G' | 18 | 8 | 1 | 8 |
| 1/A | 18 | 7 | 10 | 7 |
| 2/A'* | 10 | 8 | 18 | 8 |
| 3/CLK | 18 | 7 | 18 | 7 |
| 4/CLK' | 18 | 8 | 18 | 8 |
| 5/RESET* | 18 | 7 | 1 | 7 |
| 6/RESET'* | 18 | 8 | 1 | 8 |
| 9/B | 18 | 7 | 8 | 7 |
| 10/C | 18 | 7 | 6 | 7 |
| 11/C* | 6 | 7 | 19 | 7 |
| 12/C'* | 6 | 8 | 18 | 8 |
| 13/D | 18 | 7 | 16 | 7 |
| 14/E | 18 | 7 | 16 | 7 |
| 15/A' | 18 | 8 | 10 | 8 |
| 16/B' | 18 | 8 | 8 | 8 |
| 17/D' | 18 | 8 | 16 | 8 |
| 18/E'* | 16 | 8 | 18 | 8 |

What is claimed is:

1. An apparatus for synchronizing the leading edges of a pair of digital occurring within a predetermined time period of one another, said apparatus comprising:
   first means for receiving a first of the pair of digital signals and for storing the logic state of the first of the pair of digital signals, said first means producing a first intermediate signal having a logic state indicative of the leading edge of the first of the pair of digital signals;
   second means for receiving a second of the pair of digital signals and for storing the logic state of the second of the pair of digital signals, said second means producing a second intermediate signal having a logic state indicative of the leading edge of the second of the pair of digital signals;
   gate means for receiving the first and second intermediate signals and producing a third intermediate signal indicative of receipt of the leading edges of the pair of digital signals by the first and second means; and
   output means responsive to the first, second and third intermediate signals to produce therefrom, when the leading edges of the pair of digital signals occur within the predetermined time period, a pair of output signals representative of the pair of digital signals and having synchronized leading edges.

2. The apparatus claimed in claim 1 wherein each of said first and second means further each comprise two series-connected flip-flop stages.

3. The apparatus as claimed in claim 1 wherein the pair of digital signals are a true-complement signal pair.

4. The apparatus as claim 1, including timing means coupled to the first and second means and to the output means for producing a periodic clock signal.

5. The apparatus of claim 1, the output means including means for placing the output signals in a state indicative of the leading edges of the pair of digital signals not occurring within the predetermined time period.

* * * * *